United States Patent
Ang et al.

(10) Patent No.: US 6,709,912 B1
(45) Date of Patent: Mar. 23, 2004

(54) DUAL SI-GE POLYSILICON GATE WITH DIFFERENT GE CONCENTRATIONS FOR CMOS DEVICE OPTIMIZATION

(75) Inventors: Chew-Hoe Ang, Singapore (SG); Jeffrey Chee Wei-Lun, Singapore (SG); Wenhe Lin, Singapore (SG); Jia Zhen Zheng, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/266,425

(22) Filed: Oct. 8, 2002

(51) Int. Cl.$^7$ .......................................... H01L 21/8238
(52) U.S. Cl. ..................... 438/199; 257/19; 257/69; 257/616; 438/231; 438/585; 438/752; 438/933
(58) Field of Search ........................... 257/19, 69, 616; 438/199, 231, 483, 485, 565, 585, 752, 933

(56) References Cited

U.S. PATENT DOCUMENTS

| | | | |
|---|---|---|---|
| 6,200,866 B1 | 3/2001 | Ma et al. ..................... | 438/299 |
| 6,303,418 B1 | 10/2001 | Cha et al. .................... | 438/199 |
| 6,323,115 B1 | 11/2001 | Tanabe et al. ............... | 438/592 |
| 6,326,252 B1 | 12/2001 | Kim et al. ................... | 438/199 |
| 6,451,676 B2 * | 9/2002 | Wurzer et al. ............... | 438/528 |
| 6,524,902 B2 * | 2/2003 | Rhee et al. .................. | 438/199 |
| 6,596,605 B2 * | 7/2003 | Ha et al. ..................... | 438/417 |
| 2001/0015922 A1 * | 8/2001 | Ponomarev .................. | 365/200 |

OTHER PUBLICATIONS

Lee et al., "Investigation of Poly–$Si_{1-x}Ge_x$ for Dual–Gate CMOS Technology," IEEE EDL, vol. 19, No. 7, Jul. 1998, pp. 247–249.

Wen–Chin Lee et al., "Observation of Reduced Boron Penetration and Gate Depletion for Poly–$Si_{0.8}Ge_{0.2}$ Gated PMOS Devices," IEEE–EDL, vol. 20, No. 1, Jan. 1999, pp. 9–11.

"Enhancement of PMOS Device Performance with Poly–SiGe Gate", by Wen–Chin Lee et al., IEEE EDL, vol. 20, No. 5, May 1999, pp. 232–234.

"Work Function of Boron–Doped Polycrystalline $Si_xGe_{1-x}$ Films", IEEE EDL, vol. 18, No. 9, Sep. 1997, pp. 456–458, P.–E. Hellberg et. al.

Uejima et al., "High Reliable Poly–SiGe/Amorphous–Si Gate CMOS", IEDM 2000, pp. 18.5.1–18.5.4.

"High–Performance Deep SubMicron CMOS Tch. with Polycrystalline–SiGe Gates", by Youri V. Ponomarev et al., IEEE Trans. on Electron Devices, vol. 47, No. 4, Apr. 2000, pp. 848–855.

"A 0.13 µm Poly–SiGe Gate CMOS Tech. for Low–Voltage Mixed–Signal Applications," IEEE Trans. on Electron Device, vol. 47, No. 7, Jul. 2000, pp. 1507–1513, Youri V. Ponomarev et al.

Ponomarev et al., "Gate–Workfunction Engineering Using Poly–(Si,Ge) for High Performance 0.18µm CMOS Technology," 1997, IEDM, pp. 829–832.

* cited by examiner

Primary Examiner—Evan Pert
Assistant Examiner—Asok Kumar Sarkar
(74) Attorney, Agent, or Firm—George O. Saile; Rosemary L.S. Pike

(57) ABSTRACT

A method for forming a dual Si—Ge poly-gates having different Ge concentrations is described. An NMOS active area and a PMOS active area are provided on a semiconductor substrate separated by an isolation region. A gate oxide layer is grown overlying the semiconductor substrate in each of the active areas. A polycrystalline silicon-germanium (Si—Ge) layer is deposited overlying the gate oxide layer wherein the polycrystalline Si—Ge layer has a first Ge concentration. The NMOS active area is blocked while the PMOS active area is exposed. Successive cycles of Ge plasma doping and laser annealing into the PMOS active area are performed to achieve a second Ge concentration higher than the first Ge concentration. The polycrystalline Si—Ge layer is patterned to form a gate in each of the active areas wherein the gate in the PMOS active area has a higher Ge concentration than the gate in the NMOS active area to complete formation of dual Si—Ge polysilicon gates with different Ge concentrations in the fabrication of an integrated circuit device.

27 Claims, 4 Drawing Sheets

US 6,709,912 B1

DUAL SI-GE POLYSILICON GATE WITH DIFFERENT GE CONCENTRATIONS FOR CMOS DEVICE OPTIMIZATION

BACKGROUND OF THE INVENTION (1) Field of the Invention

The present invention relates to the fabrication of integrated circuit devices, and more particularly, to a method of fabricating dual Si—Ge polysilicon gates having different Ge concentrations in the fabrication of integrated circuits.

(2) Description of the Prior Art

Silicon-Germanium (Si—Ge) polycrystalline gates have advantages over conventional silicon polycrystalline gates. Lee et al in "Investigation of poly-$Si_{1-x}Ge_x$ for dual-gate CMOS technology," IEEE EDL, p. 247, 1998 and in "Observation of reduced boron penetration and gate depletion for poly-Si0.8Ge0.2 gated PMOS devices," IEEE EDL, p.9, 1999 have reported that polysilicon-gate depletion (PD) effect and boron penetration effect for PMOS devices is reduced with increasing Ge concentration, while NMOS devices with approximately 20% Ge concentration exhibit the least PD effect. Later, in "Enhancement of PMOS device performance with poly-SiGe gate", IEEE EDL, p. 232, 1999, Lee et al reported that the hole's mobility for PMOS devices with Si—Ge poly is higher than those devices with Si-poly.

In "Work function of boron-doped polycrystalline $Si_xGe_{1-x}$ films", IEEE EDL, p. 456, 1997, Hellberg et al reported that the work function for p$^+$-doped SiGe polycrystalline film decreases as the Ge content increases. Hence, it is possible to improve the CMOS device performance by using gate work function engineering coupled with supersteep retrograde channel engineering ("High-performance deep submicron CMOS technologies with polycrystalline-SiGe gates," Ponomarev et al, IEEE ED, p. 848, 2000) or lateral channel engineering ("A 0.13 μm poly-SiGe gate CMOS technology for low-voltage mixed-signal applications," Ponomarev et al, IEEE ED, p. 1507, 2000)

Ponomarev et al in "Gate workfunction engineering using poly-(SiGe) for high performance 0.18 μm CMOS technology," IEDM, p. 829, 1997, reported that a buffer poly-Si layer can be introduced on the Si—Ge poly gate to preserve the standard salicidation scheme. Uejima et al in "Highly reliable poly-SiGe/amorphous-Si gate CMOS", IEDM, p. 60, 2000, reported that gate oxide reliability can be improved by adding a thin amorphous silicon layer prior to Si—Ge polysilicon deposition.

Since it is desirable to have about 20% and about 50% Ge for NMOS and PMOS devices, respectively, in order to achieve the optimum performance for CMOSFET's, it is desired to provide a method for forming a dual Si—Ge poly-gate CMOSFET with different Ge concentrations for NMOS and PMOS devices.

U.S. Pat. No. 6,326,252 B1 to Kim et al, U.S. Pat. No. 6,303,418 B1 to Cha et al, and U.S. Pat. No. 6,323,115 B1 to Tanabe et al disclose dual gate processes. U.S. Pat. No. 6,200,866 B1 to Ma et al shows a replacement gate process using SiGe as the dummy gate material.

SUMMARY OF THE INVENTION

Accordingly, a primary object of the invention is to provide a process for forming dual Si—Ge poly-gates in the fabrication of integrated circuits.

A further object of the invention is to provide a process for forming dual Si—Ge poly-gates having different Ge concentrations in the fabrication of integrated circuits.

Another object of the invention is to provide a process for forming dual Si—Ge poly-gates having different Ge concentrations for NMOS and PMOS devices in the fabrication of integrated circuits.

Yet another object of the invention is to provide a process for forming dual Si—Ge poly-gates having different Ge concentrations for NMOS and PMOS devices using blanket Si—Ge polysilicon deposition followed by selective Ge implantation in the PMOS region.

In accordance with the objects of the invention, a method for forming a dual Si—Ge poly-gates having different Ge concentrations is achieved. An NMOS active area and a PMOS active area are provided on a semiconductor substrate separated by an isolation region. A gate oxide layer is grown overlying the semiconductor substrate in each of the active areas. A polycrystalline silicon-germanium (Si—Ge) layer is deposited overlying the gate oxide layer wherein the polycrystalline Si—Ge layer has a first Ge concentration. The NMOS active area is blocked while the PMOS active area is exposed. Successive cycles of Ge plasma doping and laser annealing into the PMOS active area are performed to achieve a second Ge concentration higher than the first Ge concentration. The polycrystalline Si—Ge layer is patterned to form a gate in each of the active areas wherein the gate in the PMOS active area has a higher Ge concentration than the gate in the NMOS active area to complete formation of dual Si—Ge polysilicon gates with different Ge concentrations in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
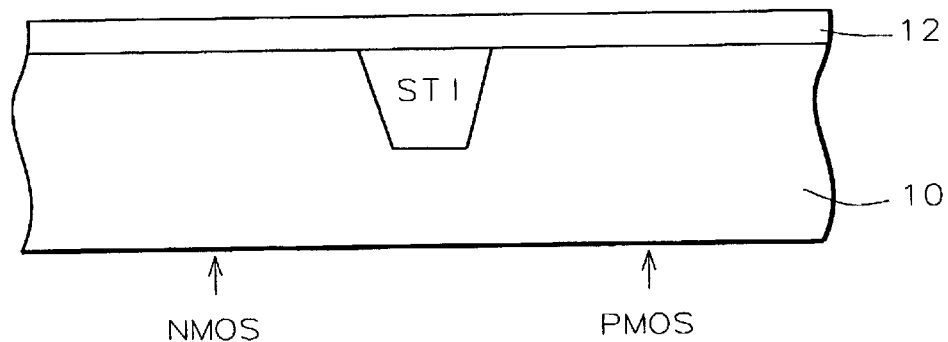
FIGS. 1 through 6 are cross-sectional representations of a preferred embodiment of the present invention.

Referring now more particularly to FIG. 1, there is shown a semiconductor substrate 10. This is preferably monocrystalline silicon, doped to be a p-type. Isolation regions, such as shallow trench isolation (STI) shown, are formed in the substrate to separate active regions. In the figures, the NMOS active region will be shown on the left and the PMOS active region will be shown on the right. A thermal gate oxide layer 12 is grown on the surface of the substrate to a thickness of between about 15 and 100 Angstroms.

Figure 2:
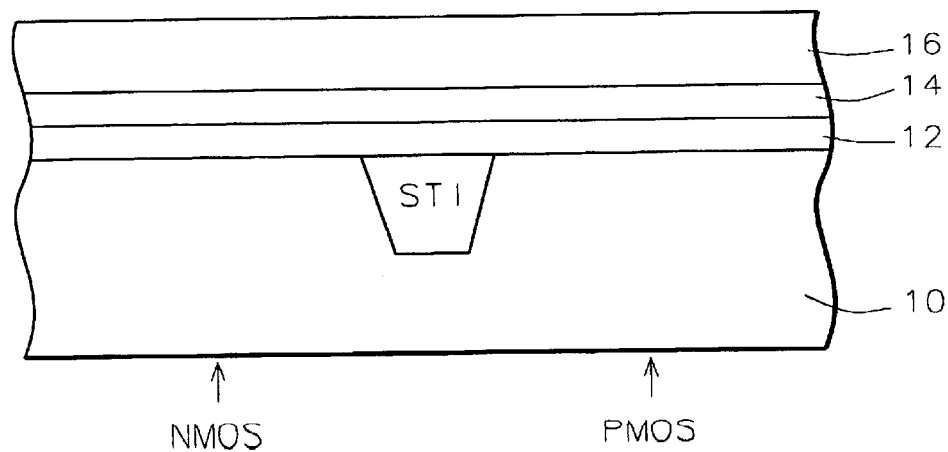

Referring now to FIG. 2, a gate stack of two layers is deposited sequentially over the gate oxide layer 12. The two layers are deposited by low pressure chemical vapor deposition (LPCVD). The first layer 14 is a thin amorphous silicon seed layer with a thickness preferably between about 1 and 5 nanometers. This layer is preferably deposited by LPCVD at between about 490 and 540° C., at a pressure of between about 0.3 and 10 torr using a $SiH_4$ flow of between about 1000 and 1500 slm. This seed layer 14 will reduce Si—Ge roughness and protects the underlayers. The second layer 16 of polycrystalline Si—Ge is deposited by LPCVD at between about 490 and 700° C., at a pressure of between about 0.3 and 10 torr using a $SiH_4$ flow of between about 1000 and 2000 slm and a $GeH_4$ flow of between about 1000 and 2000 slm. This layer 16 has a thickness of between about 100 and 150 nm. The concentration of Ge in layer 16 is preferably between about 10 and 30%.

Figure 3:
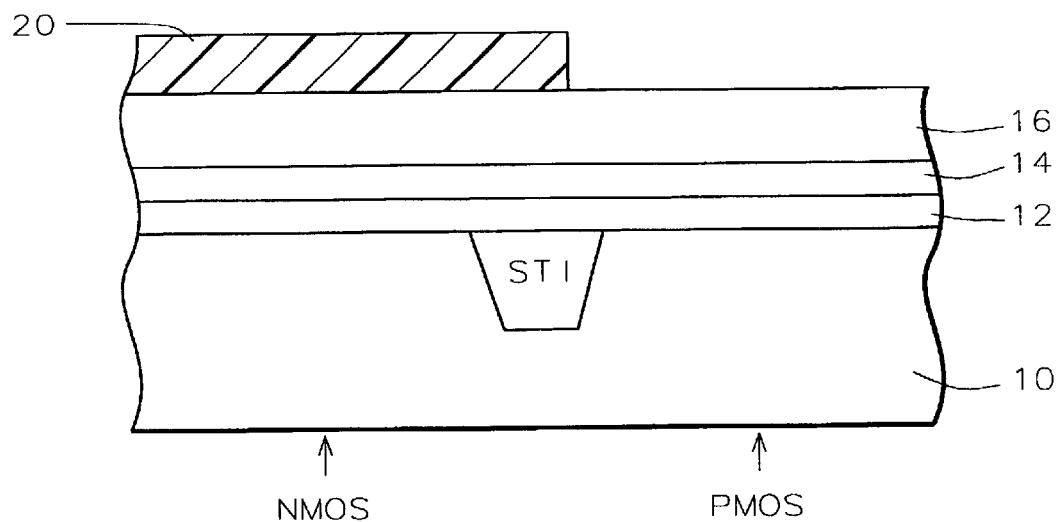
Figure 4:
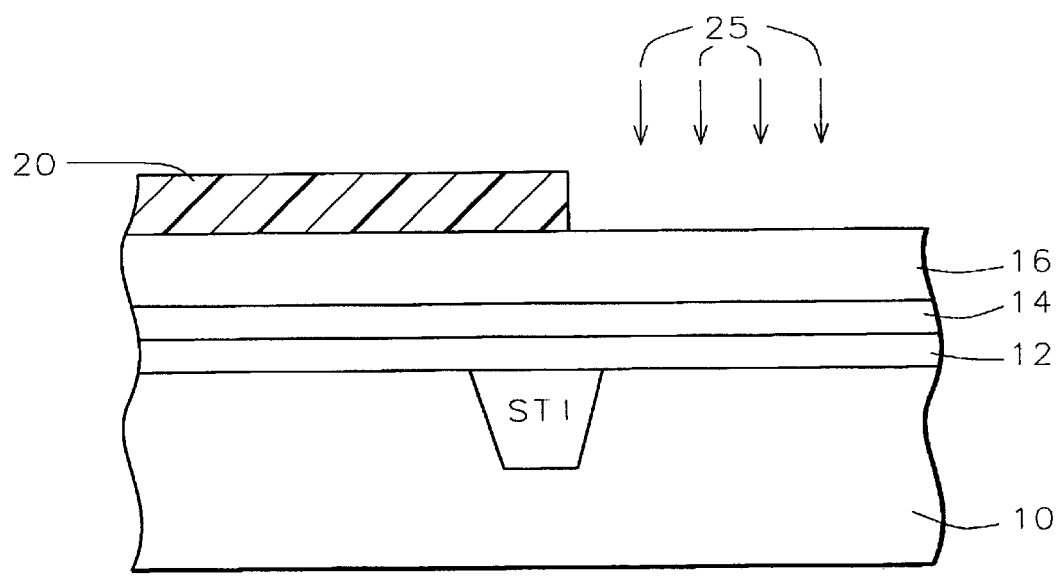

Now, the NMOS region is blocked as shown in FIG. 3 by a mask 20. Using conventional lithography, the PMOS region is exposed as shown. Now, as shown in FIG. 4, successive cycles of Ge plasma doping (PLAD) and laser annealing 25 are performed in order to achieve between about 45 and 55% Ge concentration in the PMOS region. Optionally, boron can be co-implanted to pre-dope the gate at the PMOS region using the same mask. For example, plasma doping typically uses DC voltage of between about 50 and 1000 volts. Laser annealing may be performed using a XeCl laser, for example, having a 308 µm wavelength and a 40–60 nanosecond pulse duration.

Figure 5:
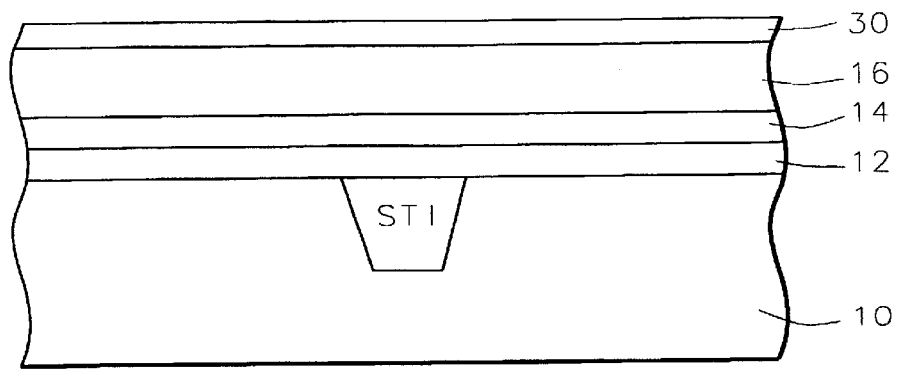

Referring now to FIG. 5, the mask 20 is removed, such as by chemical resist stripping (CRS). The surface is cleaned, using, for example, a standard RCA cleaning process. This is followed by a blanket deposition of an undoped polysilicon capping layer. The polysilicon layer 30 is deposited by LPCVD to a thickness of between about 50 and 70 nm. This layer provides compatibility with the subsequent silicidation process.

Figure 6:
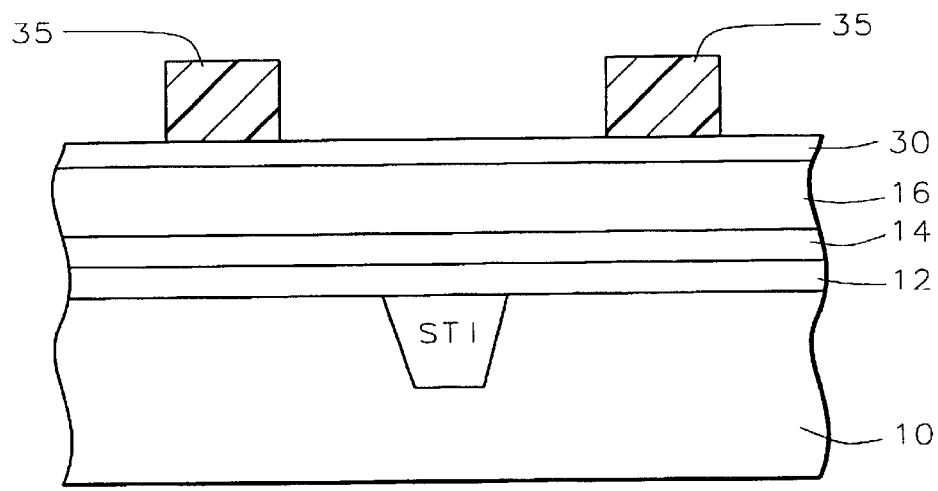
Figure 7:
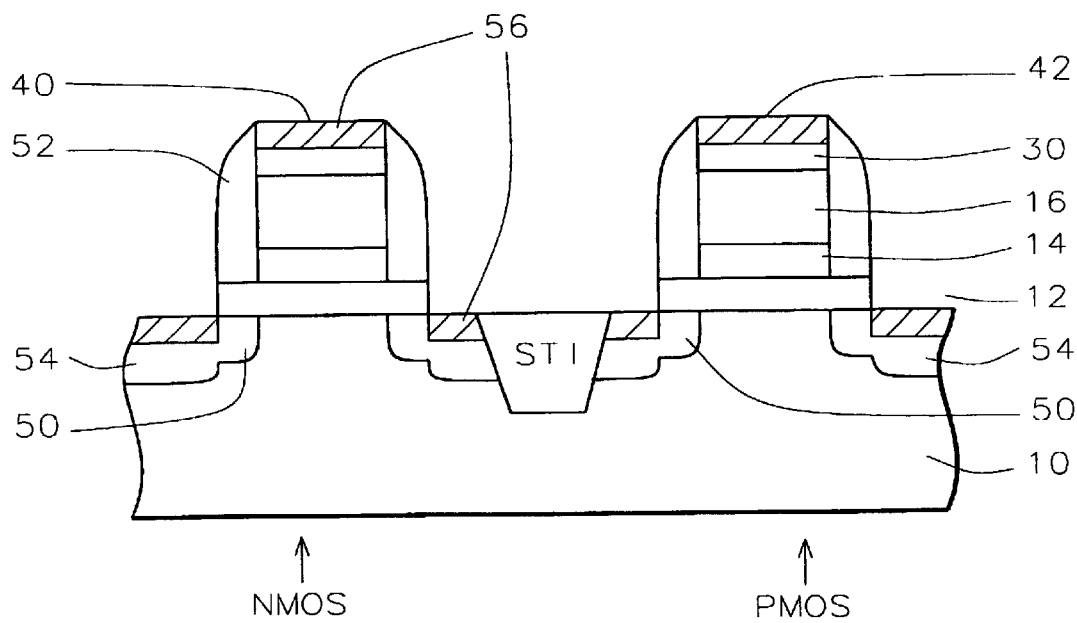
FIG. 7 is a cross-sectional representation of a completed integrated circuit fabricated according to a preferred embodiment of the present invention.

Using lithography, for example, a mask 35 is formed over the capping polysilicon layer to provide a pattern for the NMOS and PMOS gates as shown in FIG. 6. The capping layer 30, polysilicon Si—Ge layer 16, and seed layer 14 are etched to form NMOS gate 40 and PMOS gate 42, as illustrated in FIG. 7. The gates have been formed with different Ge concentrations. The NMOS gate 40 has a Ge concentration of approximately 20% while the PMOS gate 42 has a Ge concentration of approximately 50%. These concentrations provide optimum performance for the CMOSFET.

Processing continues as is conventional in the art to form source/drain extensions 50 and pocket implantation, not shown, spacers 52 on sidewalls of the gates 40 and 42, source/drain 54 formation, and silicidation 56.

The process of the present invention provides a simple, manufacturable dual Si—Ge polysilicon gate process. Each gate has different Ge concentrations for optimum performance of the CMOSFET.

While the invention has been particularly shown and described with reference to the preferred embodiments thereof, it will be understood by those skilled in the art that various changes in form and details may be made without departing from the spirit and scope of the invention.

What is claimed is:

1. A method of forming dual Si—Ge polysilicon gates with different Ge concentrations in the fabrication of an integrated circuit device comprising:

providing an NMOS active area and a PMOS active area of a substrate separated by an isolation region;

growing a gate oxide layer overlying said substrate in each of said active areas;

depositing a polycrystalline silicon-germanium (Si—Ge) layer overlying said gate oxide layer wherein said polycrystalline Si—Ge layer has a first Ge concentration;

blocking said NMOS active area while exposing said PMOS active area and performing successive cycles of Ge plasma doping and laser annealing into said PMOS active area to achieve a second Ge concentration higher than said first Ge concentration; and patterning said polycrystalline Si—Ge layer to form a gate in each of said active areas wherein said gate in said PMOS active area has a higher Ge concentration than said gate in said NMOS active area to complete formation of said dual Si—Ge polysilicon gates with different Ge concentrations in the fabrication of an integrated circuit device.

2. The method according to claim 1 wherein said gate oxide layer is grown to a thickness of between about 15 and 100 Angstroms.

3. The method according to claim 1 further comprising depositing an amorphous silicon seed layer overlying said gate oxide layer and underlying said polycrystalline Si—Ge layer.

4. The method according to claim 3 wherein said amorphous silicon seed layer is deposited by LPCVD at a temperature of between about 490 and 540° C., a pressure of between about 0.3 and 10 torr, and with a $SiH_4$ flow of between about 1000 and 1500 slm.

5. The method according to claim 3 wherein said amorphous silicon seed layer has a thickness of between about 1 and 5 nm.

6. The method according to claim 1 wherein said polycrystalline Si—Ge layer has a thickness of between about 100 and 150 nm.

7. The method according to claim 1 wherein said polycrystalline Si—Ge layer is deposited by LPCVD at a temperature of between about 490 and 700° C., a pressure of between about 0.3 and 10 torr, and with a $SiH_4$ flow of between about 1000 and 2000 slm and Ge flow of between about 1000 and 2000 slm.

8. The method according to claim 1 wherein said first concentration is between about 10 and 30%.

9. The method according to claim 1 wherein said second concentration is between about 45 and 55%.

10. The method according to claim 1 further comprising implanting boron ions into said PMOS active area during said step of performing successive cycles of Ge plasma doping and laser annealing wherein said implanting said boron ions pre-dopes said PMOS gate.

11. The method according to claim 1 further comprising depositing an undoped polysilicon layer overlying said polycrystalline Si—Ge layer prior to said step of patterning said polycrystalline Si—Ge layer wherein said undoped polysilicon layer forms a capping layer on said gates.

12. The method according to claim 11 further comprising:

forming source and drain extensions within said substrate adjacent to said gates;

thereafter forming dielectric spacers on sidewalls of said gates;

forming source and drain regions within said substrate adjacent to said gates and not covered by said spacers; and siliciding said gates and said source and drain regions.

13. A method of forming dual Si—Ge polysilicon gates with different Ge concentrations in the fabrication of an integrated circuit device comprising:

providing an NMOS active area and a PMOS active area of a substrate separated by an isolation region;

growing a gate oxide layer overlying said substrate in each of said active areas;

depositing an amorphous silicon seed layer overlying said gate oxide layer;

depositing a polycrystalline silicon-germanium (Si—Ge) layer overlying said amorphous silicon seed layer wherein said polycrystalline Si—Ge layer has a first Ge concentration;

blocking said NMOS active area while exposing said PMOS active area and performing successive cycles of Ge plasma doping and laser annealing into said PMOS active area to achieve a second Ge concentration higher than said first Ge concentration;

thereafter depositing an undoped polysilicon layer overlying said polycrystalline Si—Ge layer; and patterning said polycrystalline Si—Ge layer to form a gate in each of said active areas wherein said gate in said PMOS active area has a higher Ge concentration than said gate in said NMOS active area to complete formation of said dual Si—Ge polysilicon gates with different Ge concentrations in the fabrication of an integrated circuit device.

14. The method according to claim 13 wherein said gate oxide layer is grown to a thickness of between about 15 and 100 Angstroms.

15. The method according to claim 13 wherein said amorphous silicon seed layer is deposited by LPCVD at a temperature of between about 490 and 540° C., a pressure of between about 0.3 and 10 torr, and with a $SiH_4$ flow of between about 1000 and 1500 slm.

16. The method according to claim 13 wherein said amorphous silicon seed layer has a thickness of between about 1 and 5 nm.

17. The method according to claim 13 wherein said polycrystalline Si—Ge layer has a thickness of between about 100 and 150 nm.

18. The method according to claim 13 wherein said polycrystalline Si—Ge layer is deposited by LPCVD at a temperature of between about 490 and 700° C., a pressure of between about 0.3 and 10 torr, and with a $SiH_4$ flow of between about 1000 and 2000 slm and Ge flow of between about 1000 and 2000 slm.

19. The method according to claim 13 wherein said first concentration is between about 10 and 30%.

20. The method according to claim 13 wherein said second concentration is between about 45 and 55%.

21. The method according to claim 13 further comprising implanting boron ions into said PMOS active area during said step of performing successive cycles of Ge plasma doping and laser annealing wherein said implanting said boron ions pre-dopes said PMOS gate.

22. The method according to claim 13 further comprising:

forming source and drain extensions within said substrate adjacent to said gates;

thereafter forming dielectric spacers on sidewalls of said gates;

forming source and drain regions within said substrate adjacent to said gates and not covered by said spacers; and siliciding said gates and said source and drain regions.

23. A method of forming dual Si—Ge polysilicon gates with different Ge concentrations in the fabrication of an integrated circuit device comprising:

providing an NMOS active area and a PMOS active area of a substrate separated by an isolation region;

growing a gate oxide layer overlying said substrate in each of said active areas;

depositing an amorphous silicon seed layer overlying said gate oxide layer;

depositing a polycrystalline silicon-germanium (Si—Ge) layer overlying said amorphous silicon seed layer wherein said polycrystalline Si—Ge layer has a first Ge concentration;

blocking said NMOS active area while exposing said PMOS active area and performing successive cycles of Ge plasma doping and laser annealing into said PMOS active area to achieve a second Ge concentration higher than said first Ge concentration;

thereafter depositing an undoped polysilicon layer overlying said polycrystalline Si—Ge layer;

patterning said polycrystalline Si—Ge layer to form a gate in each of said active areas wherein said gate in said PMOS active area has a higher Ge concentration than said gate in said NMOS active area;

forming source and drain extensions within said substrate adjacent to said gates;

thereafter forming dielectric spacers on sidewalls of said gates;

forming source and drain regions within said substrate adjacent to said gates and not covered by said spacers; and siliciding said gates and said source and drain regions to complete formation of said dual Si—Ge polysilicon gates with different Ge concentrations in the fabrication of an integrated circuit device.

24. The method according to claim 23 wherein said amorphous silicon seed layer is deposited by LPCVD at a temperature of between about 490 and 540° C., a pressure of between about 0.3 and 10 torr, and with a $SiH_4$ flow of between about 1000 and 2000 slm to a thickness of between about 1 and 5 nm.

25. The method according to claim 23 wherein said polycrystalline Si—Ge layer is deposited by LPCVD at a temperature of between about 490 and 700° C., a pressure of between about 0.3 and 10 torr, and with a $SiH_4$ flow of between about 1000 and 2000 slm and Ge flow of between about 1000 and 2000 slm to a thickness of between about 100 and 150 nm.

26. The method according to claim 23 wherein said first concentration is between about 10 and 30% and wherein said second concentration is between about 45 and 55%.

27. The method according to claim 23 further comprising implanting boron ions into said PMOS active area during said step of performing successive cycles of Ge plasma doping and laser annealing wherein said implanting said boron ions pre-dopes said PMOS gate.

* * * * *